(12) United States Patent
Matsushita et al.

(10) Patent No.: US 9,136,108 B2
(45) Date of Patent: Sep. 15, 2015

(54) METHOD FOR RESTORING POROUS SURFACE OF DIELECTRIC LAYER BY UV LIGHT-ASSISTED ALD

(71) Applicant: ASM IP Holding B.V., Almere (NL)

(72) Inventors: Kiyohiro Matsushita, Fuchu (JP); Hirofumi Arai, Sagamihara (JP)

(73) Assignee: ASM IP Holding B.V., Almere (NL)

( * ) Notice: Subject to any disclaimer, the term of this patent is extended or adjusted under 35 U.S.C. 154(b) by 108 days.

(21) Appl. No.: 14/018,231

(22) Filed: Sep. 4, 2013

(65) Prior Publication Data

US 2015/0064932 A1    Mar. 5, 2015

(51) Int. Cl.
*H01L 21/00* (2006.01)
*H01L 21/02* (2006.01)
*H01L 21/3105* (2006.01)
*C23C 16/34* (2006.01)
*C23C 16/455* (2006.01)

(52) U.S. Cl.
CPC ........ *H01L 21/02126* (2013.01); *C23C 16/345* (2013.01); *C23C 16/45536* (2013.01); *H01L 21/0228* (2013.01); *H01L 21/02164* (2013.01); *H01L 21/02222* (2013.01); *H01L 21/02277* (2013.01); *H01L 21/3105* (2013.01)

(58) Field of Classification Search
CPC .................. H01L 21/02274; H01L 21/02348; H01L 21/02126; H01L 21/3105; C23C 16/345; C23C 16/45536
See application file for complete search history.

(56) References Cited

U.S. PATENT DOCUMENTS

| | | |
|---|---|---|
| 6,475,930 B1 | 11/2002 | Junker et al. |
| 7,825,040 B1 | 11/2010 | Fukazawa et al. |
| 7,851,232 B2 * | 12/2010 | van Schravendijk et al. ..... 438/4 |
| 7,897,215 B1 | 3/2011 | Fair et al. |
| 2004/0247779 A1 | 12/2004 | Selvamanickam et al. |
| 2007/0232031 A1 | 10/2007 | Singh et al. |
| 2011/0159202 A1 | 6/2011 | Matsushita et al. |

* cited by examiner

*Primary Examiner* — Richard Booth
(74) *Attorney, Agent, or Firm* — Snell & Wilmer LLP

(57) ABSTRACT

A method for restoring a porous surface of a dielectric layer formed on a substrate, includes: (i) providing in a reaction space a substrate on which a dielectric layer having a porous surface with terminal hydroxyl groups is formed as an outer layer; (ii) supplying gas of a Si—N compound containing a Si—N bond to the reaction space to chemisorb the Si—N compound onto the surface with the terminal hydroxyl groups; (iii) irradiating the Si—N compound-chemisorbed surface with a pulse of UV light in an oxidizing atmosphere to oxidize the surface and provide terminal hydroxyl groups to the surface; and (iv) repeating steps (ii) through (iii) to form a film on the porous surface of the dielectric layer for restoration.

20 Claims, 5 Drawing Sheets

METHOD FOR RESTORING POROUS SURFACE OF DIELECTRIC LAYER BY UV LIGHT-ASSISTED ALD

BACKGROUND OF THE INVENTION

1. Field of the Invention

The present invention generally relates to a method for repairing a damaged surface and/or sealing pores of a surface of a dielectric film.

2. Description of the Related Art

As the size of semiconductor devices has continuously become smaller, a reduction of dielectric constant of dielectric films becomes crucial. However, process-induced damage on dielectric films is related to carbon depletion, moisture absorption, and barrier metal layer diffusion due to their high porosity, and is a very serious problem. Because of the problem, the necessity for technology that repairs the damage and seals the pores of the dielectric films is increasing.

Conventionally, very thin dielectric layers formed by plasma-enhanced chemical vapor deposition (PECVD) or plasma-enhanced atomic layer deposition (PEALD) have been proposed to repair process-induced damage and seal pores at a surface of dielectric films, but they have never been successful on actual industrial applications or on a mass production scale because their step coverage is poor and/or a plasma used in their process also causes damage to surfaces of the dielectric films.

Any discussion of problems and solutions involved in the related art has been included in this disclosure solely for the purposes of providing a context for the present invention, and should not be taken as an admission that any or all of the discussion were known at the time the invention was made.

SUMMARY OF THE INVENTION

In order to overcome the above problems in PEALD, according to some embodiments, UV light irradiation is employed, in place of plasma, PEALD, for restoring damaged surfaces of a dielectric film, wherein UV light irradiation on a substrate surface and chemisorption of reactant gas on the treated surface are repeated as a cycle, results in good step coverage. This technology may be referred to as UV light-assisted ALD.

UV light irradiation as surface treatment in place of plasma exposure can avoid plasma related damage, and can form a thin film with good step coverage. Since process gases for forming a thin film also have the capability to repair low-k damage (damage occurring in dielectric films), the damage repair and thin film formation can be performed at the same time. One of the features of some embodiments is intermittent irradiation of UV light to seal pores and continuously deposit a film on a damaged surface of dielectric film.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

Figure 1:
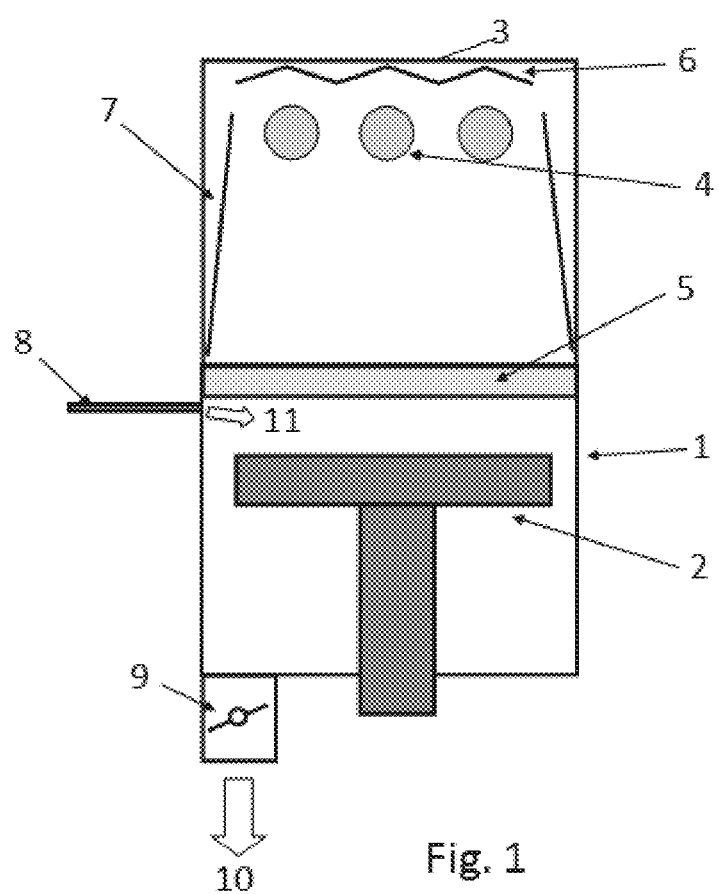
FIG. 1 is a schematic view of a UV system usable in an embodiment of the present invention.

In this disclosure, "gas" may include vaporized solid and/or liquid and may be constituted by a single gas or a mixture of gases. Likewise, an article "a" or "an" refers to a species or a genus including multiple species. In this disclosure, a process gas introduced to a reaction chamber through a showerhead may be comprised of, consist essentially of, or consist of a reactive gas such as a silicon-containing precursor or an oxidizing gas and a carrier gas such as a rare gas. A gas other than the precursor gas, i.e., a gas introduced without passing through the showerhead, may be used for, e.g., sealing the reaction space, which includes a seal gas such as a rare gas. In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. Further, in this disclosure, any two numbers of a variable can constitute an workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

In this disclosure, any defined meanings do not necessarily exclude ordinary and customary meanings in some embodiments.

Embodiments will be explained with respect to preferred embodiments. However, the present invention is not limited to the preferred embodiments.

According to some embodiments, a method for restoring a porous surface of a dielectric layer formed on a substrate, comprises: (i) providing in a reaction space a substrate on which a dielectric layer having a porous surface with terminal hydroxyl groups is formed as an outer layer; (ii) supplying gas of a Si—N compound containing a Si—N bond to the reaction space to chemisorb the Si—N compound onto the surface with the terminal hydroxyl groups; (iii) irradiating the Si—N compound-chemisorbed surface with a pulse of UV light in an oxidizing atmosphere to oxidize the surface and provide terminal hydroxyl groups to the surface; and (iv) repeating steps (ii) through (iii) to form a film on the porous surface of the dielectric layer for restoration.

In the above, "containing a Si—N bond" may refer to containing at least one Si—N bond in a constituent molecule, being characterized by Si—N bond(s), being constituted mainly or predominantly by Si—N bond(s), and/or having a main skeleton substantially constituted by Si—N bond(s). Steps (ii) and (iii) constitute a cycle of atomic layer deposition (ALD). Since ALD is a self-limiting adsorption reaction process, the amount of deposited precursor molecules is determined by the number of reactive surface sites and is independent of the precursor exposure after saturation, and a supply of the precursor is such that the reactive surface sites are saturated thereby per cycle. In this disclosure, "chemisorption" refers to chemical saturation adsorption. According to the UV light-assisted ALD, damage repair and thin film formation can be performed at the same time, i.e., sealing pores and depositing a film on a damaged surface of dielectric film can continuously be performed. In some embodiments, in step (ii), the chemisorption is a self-limiting adsorption, surface reaction.

In some embodiments, the Si—N bond of the Si—N compound is reactive to a hydroxyl group and replaces the hydrogen atom with the silicon moiety in step (ii), and the silicon moiety is oxidized in step (iii), providing a terminal hydroxyl group. In the above, nitrogen in the Si—N compound is removed with hydrogen from the surface of the substrate. By repeating steps (ii) and (iii), a film can be formed in step (iv), which film is constituted by SiOC or SiO in some embodiments.

In some embodiments, in step (iii), the oxidizing atmosphere is an atmosphere of oxygen-containing gas or oxidizing gas such as $O_2$, $O_3$, $CO_2$, $NO_2$, $H_2O$, etc., or a mixture thereof, preferably $O_2$. In some embodiments, the oxidizing atmosphere contains a low concentration of oxygen which is not sufficient to strip the entire alkyl groups from the surface (also insufficient to remove hydrocarbon from the matrix of the film), but sufficient to replace some of alkyl groups with hydroxyl groups on the surface.

In some embodiments, the method further comprises removing non-chemisorbed Si—N compound from the surface by purging the reaction space between consecutive steps (ii) and (iii). The purging can be conducted by continuously supplying a rare gas and/or an oxidizing gas to a reaction chamber without supplying the Si—N compound thereto, with or without vacuuming the reaction chamber. Likewise, in some embodiments, the method further comprises purging the reaction space between consecutive steps (iii) and (ii) when repeating steps (ii) through (iii).

In some embodiments, the Si—N compound is an organosilazane compound, an organoaminosilane, a derivative of the foregoing, or a mixture of the foregoing. In some embodiments, the Si—N compound may be selected from the group consisting of alkylaminosilane, dialkylaminosilane, bis(alkylamino)silane, bis(dialkylamino)silane, tris(alkylamino)silane, tris(dialkylamino)silane, tetrakis(alkylamino)silane, dialkylamino)silane, alkyl-substituted disilazane, alkyl-substituted trisilazane, alkyl-substituted tetrasilazane, alkyl-substituted polysilazane, alkyl-substituted silazane, alkyl-substituted cyclotrisilazane, alkyl-substituted cyclotetrasilazane, and a derivative of the foregoing. In some embodiments, the Si—N compound is an aminosilane or silazane without alkyl substituents. Preferably, as an organoaminosilane, bisdiethylaminosilane (BDEAS), dimethylaminotrimethylsilane (DMATMS), and/or di-sec-butylaminosilane (DSBAS) can be used.

The dielectric film includes, but is not limited to, a low-k film constituted by SiC, or boron-based multi-element materials such as borozine, or multi-element hydrocarbon materials, etc., having a dielectric constant of about 1.9 to 5.0, typically about 2.1 to 3.0, preferably less than 2.5. In some embodiments, the dielectric film is formed in trenches or vias including side walls and bottom surfaces, and/or flat surfaces, by plasma-enhanced CVD, thermal CVD, cyclic CVD, plasma-enhanced ALD, thermal ALD, radical-enhanced ALD, or any other thin film deposition methods. Typically, the thickness of the dielectric film is in a range of about 50 nm to about 500 nm (a desired film thickness can be selected as deemed appropriate according to the application and purpose of film, etc.).

In some embodiments, in step (iv), steps (ii) through (iii) are continuously repeated more than 2 times, typically 10 times to 500 times, preferably 30 times to 200 times, depending on the desired thickness of the film formed on the porous surface of the dielectric film, the degree of the damage caused to the porous surface of the dielectric film, etc. In the above, "continuously" refers to without breaking a vacuum, without interruption as a timeline, without changing treatment conditions, immediately thereafter, as a next step, or without a discrete physical or chemical boundary between two structures in some embodiments.

In some embodiments, the film formed in step (iv) has a thickness of about 0.1 nm to about 100 nm, preferably about 1 nm to about 50 nm (typically about 4 nm to about 20 nm), depending on the intended use of the substrate, etc.

In some embodiments, the duration of step (iii) is about 0.1 second to about 60 seconds, preferably about 1 second to about 10 seconds, depending on how easily the adsorbed Si—N compound can be oxidized, etc.

In some embodiments, in step (iii), the intensity of the UV light is about 40 $mW/cm^2$ to about 400 $mW/cm^2$ per area of the substrate, typically about 100 $mW/cm^2$ to about 300 $mW/cm^2$ per area of the substrate. In some embodiments, the UV light may have a wavelength of about 200 nm or higher. Types of lamps that can be used to irradiate UV light include, for example, high-pressure mercury lamps, low-pressure mercury lamps, xenon excimer lamps and metal halide lamps.

In general, a damaged layer has lost carbon in the film and become hydrophilic, and can therefore cause the dielectric constant to rise if moisture is absorbed later on. In some embodiments, in step (i), the porous surface of the dielectric layer is constituted by pores and is hydroxyl group-terminated by irradiating the substrate with UV light in an oxidizing atmosphere to oxidize the surface and provide terminal hydroxyl groups to the surface. In some embodiments, in step (i), the porous surface with terminal hydroxyl groups is a chemically degraded surface. In some embodiments, the chemically degraded surface is a surface damaged by etching, ashing, or cleaning. In some embodiments, the chemically degraded surface is surfaces of trenches formed on the surface of the dielectric layer, where the film formed in step (iv) is conformal. In the above, "conformal film" refers to a film having a ratio of thickness of side portions to thickness of top/bottom portions of about 0.7 to about 1.30.

In an embodiment, the UV light-assisted ALD can be conducted under the conditions shown in Table 1.

TABLE 1

(the numbers are approximate)

| | Conditions for UV light-assisted ALD |
|---|---|
| Flow rate of precursor gas (sccm) - intermittent | 50 to 800 (preferably 100 to 300) |
| Duration of supply pulse of precursor gas (seconds) | 0.3 to 5.0 (preferably 1 to 2) |
| Type of carrier gas | Ar, He, $N_2$ |
| Flow rate of carrier gas (sccm) - continuous | 1000 to 10000 (preferably 1000 to 3000) |
| Duration of purge (seconds) | 2 to 20 (preferably 5 to 14) |
| Type of oxidizing gas | $O_2$ |
| Flow rate of oxidizing gas (sccm) - continuous | 2 to 1000 (preferably 5 to 100, less than precursor gas, e.g., 5 to 10) |
| UV wavelength (nm) | 200 to 400 |
| UV power (W/cm$^2$) | 40 to 400 (preferably 50 to 200) |
| Irradiation time (seconds) | 1 to 20 (preferably 5 to 10) |
| Substrate temperature (° C.) | 100 to 450 (preferably 200 to 300) |
| Pressure (Torr) | 1 to 8 (preferably 2 to 4) |
| Number of cycles | ~100 (depending on the desired film thickness) |
| Film thickness (nm) | 1 to 12 (e.g., 4-10, depending on the intended use) |

Figure 2:
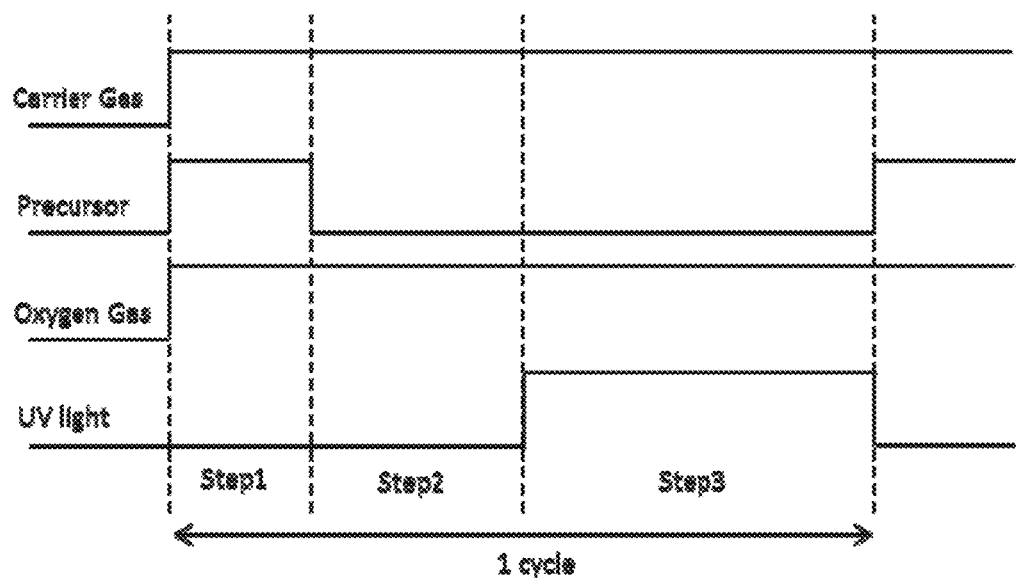
FIG. 2 is a diagram illustrating a cycle of UV light-assisted ALD according to an embodiment of the present invention.

FIG. 2 is a diagram illustrating a cycle of UV light-assisted ALD according to an embodiment of the present invention. In this embodiment, a substrate having as the outermost layer a dielectric layer with a porous surface formed thereon is placed in a reaction chamber, wherein the porous surface has terminal hydroxyl groups. In step 1, a precursor gas is supplied to the reaction space in a pulse, wherein the precursor gas is supplied together with a carrier gas which is continuously supplied to the reaction space and is intermittently dosed with the precursor gas upstream of the reaction space for supplying the precursor gas to the reaction space. An oxidizing gas is also continuously supplied to the reaction space for stable reaction when UV light irradiation begins. In step 1, the precursor is chemisorbed onto the surface of the substrate. Step 1 corresponds to aforesaid step (ii). In step 2, no precursor gas is supplied, but as described above, the carrier gas and the oxidizing gas are continuously supplied so that non-chemisorbed precursor is removed from the surface of the substrate, constituting a purge step. In steps 1 and 2, no UV light irradiation is conducted. In step 3, UV light irradiation is conducted in a pulse, while the carrier gas and the oxidizing gas are supplied without supplying the precursor gas, so that the precursor-chemisorbed surface is irradiated with a pulse of UV light in an oxidizing atmosphere, thereby oxidizing the surface and providing terminal hydroxyl groups to the surface. Step 3 corresponds to aforesaid step (iii). Steps 1 to 3 constitute one cycle of the UV light-assisted ALD, and the cycle is repeated to form a film on the porous surface of the dielectric layer for restoration. In an embodiment, the oxidizing gas is diluted with a rare gas such as Ar. UV light can be intermittently emitted at desired intervals by switching electric power or using a stroboscope mechanism.

In FIG. 2, alternatively, the oxidizing gas flow can be pulsed and synchronized with the pulse of UV light irradiation. In FIG. 2, although no purge step needs to be performed between step 3 and next step 1, a purge step can be added. Further, in FIG. 2, alternatively, the carrier gas flow can be pulsed and synchronized with the pulse of the precursor flow.

In an embodiment, pore seal layer formation on a low-k film by UV process can be conducted as follows:

1) A substrate is transferred to a reaction chamber and placed on a heater table, and then heated up to 300° C. under vacuumed pressure.

2) Oxygen gas is supplied into the chamber and then the chamber pressure is adjusted to a given level. UV light is emitted onto the substrate and ozone is generated. The ozone oxidizes the low-k film partially, forming —OH groups on the surface for subsequent pore seal reaction. The degree of the oxidation is adjusted by irradiation time, pressure, and flow rate of oxygen.

3) UV irradiation is stopped and the reaction chamber is evaluated, and then organoaminosilazane gas is supplied to the chamber. The organoaminosilazane gas is chemisorbed to the low-k film surface at the —OH groups, forming —O—SiR$_3$ groups (R represents alkyl group).

4) After the surface of the low-k film is saturated with the chemisorptions, the organoaminosilazane gas flow is stopped, and the reaction chamber is evacuated.

5) Steps 2) to 4) are repeated until a pore seal layer having a desired thickness is formed, wherein in step 2) above, the ozone oxidizes the low-k film partially, forming —O—SiR$_2$—OH groups on the surface.

In another embodiment where an initial surface of a low-k film already has sufficient —OH groups, pore seal layer formation can be conducted by UV process as follows:

1) A substrate is transferred to a reaction chamber and placed on a heater table, and then heated up to 300° C. under vacuumed pressure.

2) Organoaminosilazane gas is supplied into the reaction chamber, and then the chamber pressure is adjusted to a given level. The organoaminosilazane gas is chemisorbed to the damaged low-k film surface at —OH groups, forming —O—SiR$_3$ groups. By doing this, k value and hydrophobicity of the low-k film are recovered.

3) Once the surface is saturated with the chemisorptions, the organoaminosilazane gas flow is stopped and the chamber is evaluated.

4) Oxygen gas is supplied into the chamber, and UV light is emitted onto the substrate. UV irradiation generates ozone and oxidizes the low-k film so that —O—SiR$_2$—OH groups are formed on the surface for subsequent pore seal reaction. The degree of the oxidation is adjusted by irradiation time, pressure, and flow rate of oxygen.

5) After completion of the oxidation, UV irradiation and oxygen supply are stopped, and then the reaction chamber is evaluated.

6) Organoaminosilazane gas is supplied into the chamber, and then the chamber pressure is adjusted to a given level. The organoaminosilazane gas is chemisorbed to the surface at —OH groups, forming —O—SiR$_3$ groups.

7) Once the surface is saturated with the chemisorptions, the organoaminosilazane gas flow is stopped, and the chamber is evacuated.

8) Steps 4) to 7) are repeated until a pore seal layer having a desired thickness is formed.

UV irradiation dehydrates the low-k film, and causes the reaction between organoaminosilazane and —OH groups, thereby recovering damage and k-value of the low-k film. Further, by repeating oxidation of the surface of the low-k film with UV light and chemisorptions of the organoaminosilazane, a thin film having good step coverage can be formed on the surface of the low-k film. Further, because curing with UV light can be conducted simultaneously with the film deposition, a film which is dense and has good hermeticity can be formed.

FIG. 1 is a schematic view of a UV system usable in an embodiment of the present invention, desirably in conjunction with controls programmed to conduct the sequences described above, for example. As shown in FIG. 1, the UV irradiation apparatus used in this example comprises a UV lamp unit 3, UV irradiation window 5, vacuum reactor 1, heater table 2, process gas inlet tube 8, process gas inlet port 11, vacuum pump 10, and pressure control valve 9. The UV lamp unit 3 has UV mirrors 6, 7 for efficient irradiation of UV light. Note that multiple process gas inlet ports may be provided at roughly an equal pitch along the inner periphery walls of the reactor to allow gas to be introduced toward the center from the inner peripheral walls of the reactor.

Note that the present invention is not at all limited to the apparatus shown in this figure and any other apparatus can be used so long as it can irradiate UV light. The apparatus shown comprises a chamber that can be controlled to pressures from vacuum to around atmospheric pressure, and a UV irradiation unit provided on top of the chamber.

A skilled artisan will appreciate that the apparatus includes one or more controller(s) (not shown) programmed or otherwise configured to cause the deposition and reactor cleaning processes described elsewhere herein to be conducted. The controller(s) are communicated with the various power sources, heating systems, pumps, robotics and gas flow controllers or valves of the reactor, as will be appreciated by the skilled artisan.

EXAMPLES

Example 1

In this example, the apparatus shown in the schematic diagram of FIG. 1 was used to restore damaged surface of a dielectric film formed on a substrate using the process sequence illustrated in FIG. 2 under the conditions shown in Table 2.

TABLE 2

| | |
|---|---|
| Flow rate of precursor gas* (sccm) - intermittent | 280 |
| Duration of supply pulse of precursor gas (seconds) - Step 1 | 2.0 |
| Type of carrier gas | Ar |
| Flow rate of carrier gas (sccm) - continuous | 2000 |
| Duration of purge (seconds) - Step 2 | 5.0 |
| Type of oxidizing gas | $O_2$ |
| Flow rate of oxidizing gas (sccm) - continuous | 5 |
| UV wavelength (nm) | 365 |
| UV power (W/cm$^2$) | 120 |
| Irradiation time (seconds) - Step 3 | 10 |
| Pressure (Torr) | 2.0 |
| Number of cycles | 100 |

*Organoaminosilane precursor (BDEAS)

Method of Experiment

A Si wafer (300 mm in diameter) on which a porous low-k film (k2.4 siloxane polymer film of 500 nm in film thickness, about 25% in porosity and about 1.2 g/cm$^3$ in density) had been formed via plasma CVD and then exposed to oxygen plasma was transported to the heater table in the reactor under atmospheric pressure, followed by the following steps 1 to 4. The heater table temperature was 25° C.

1) The precursor was supplied to the reactor in a pulse while supplying Ar gas, thereby chemisorbing the precursor onto a surface of the dielectric film. Oxygen gas was also supplied to the reactor.

2) The precursor supply was stopped while maintaining the Ar gas supply and the oxygen gas supply, thereby purging the reaction space.

3) UV light (using a high-pressure mercury lamp) was irradiated onto the Si wafer in a pulse via the UV irradiation glass (made of quartz), thereby oxidizing the precursor-chemisorbed surface of the substrate.

4) Steps 1 to 3 were repeated 100 times, thereby forming a restoring film on the surface of the dielectric film.

Figure 3:
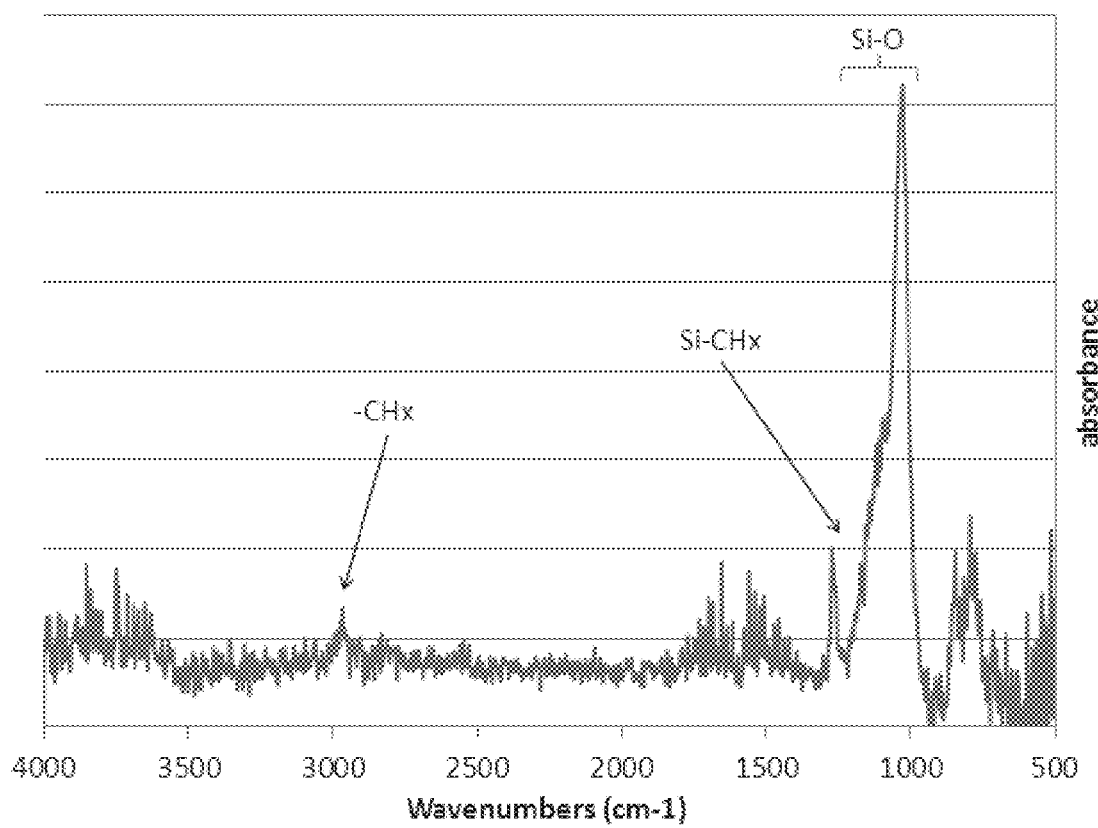
FIG. 3 is a Fourier Transform Infrared (FTIR) spectrum of a conformal silicon oxide film formed according to an embodiment of the present invention.

FIG. 3 is a Fourier Transform Infrared (FTIR) spectrum of the thus-obtained conformal film, showing that the film was a carbon-doped silicon oxide film.

Example 2

A Si substrate having an isolated pattern (the distance between adjacent convex patterns was so great that the pattern could be considered to be constituted by an isolated pattern) was used and subjected to steps 1 to 4 under the same conditions as in Example 1 to form a repair film on the substrate.

Figure 4:
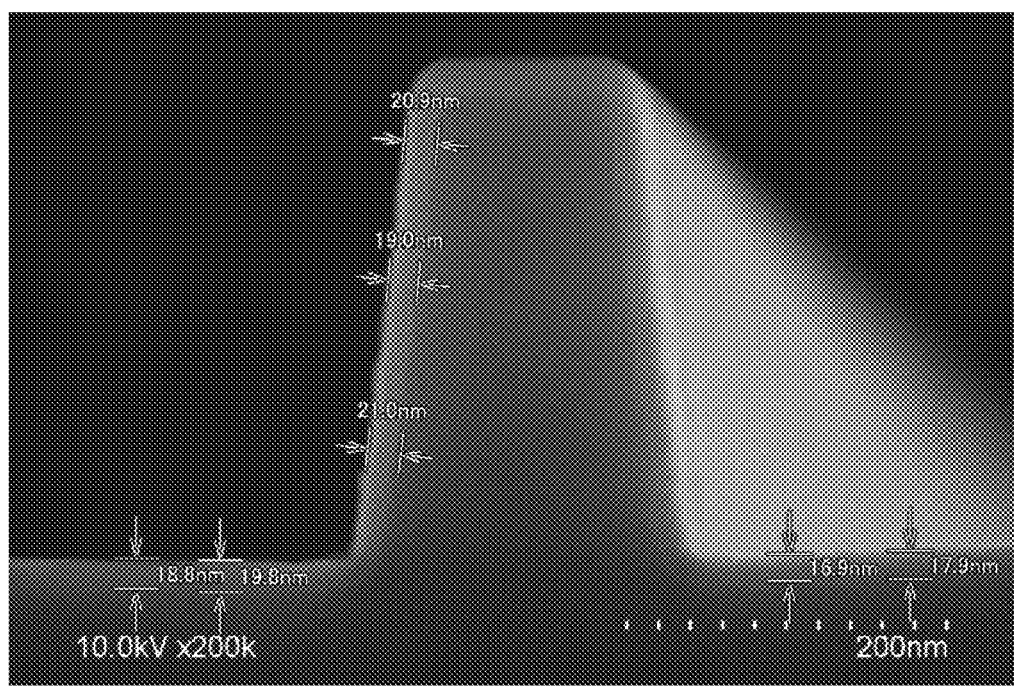
FIG. 4 is a Scanning Electron Microscope (SEM) photograph of a cross-sectional view of a conformal silicon oxide film formed on a patterned silicon sample (isolated pattern) according to an embodiment of the present invention.

FIG. 4 is a Scanning Electron Microscope (SEM) photograph of a cross-sectional view of the conformal silicon oxide film formed on the patterned silicon sample (isolated pattern). The step coverage was calculated at 124%.

Example 3

A Si substrate having a dense pattern (the distance between adjacent convex patterns was so close that the pattern could be considered to be constituted by a dense pattern) was used and subjected to steps 1 to 4 under the same conditions as in Example 1 to form a repair film on the substrate.

Figure 5:
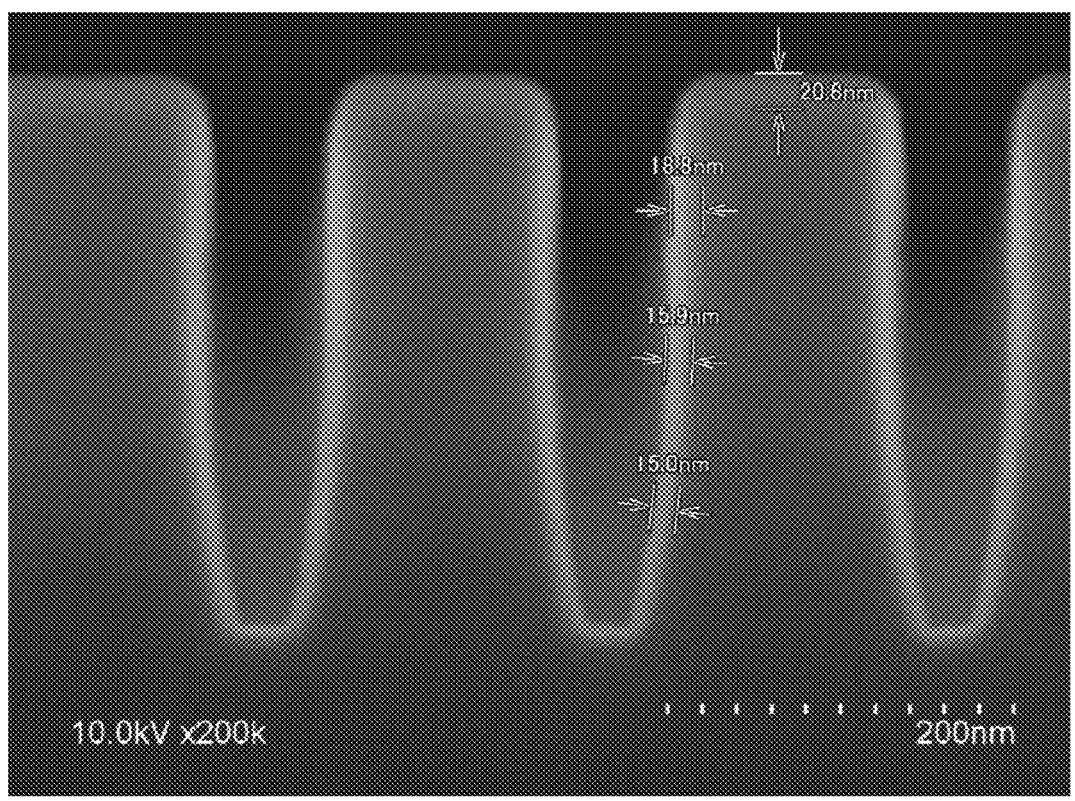
FIG. 5 is a Scanning Electron Microscope (SEM) photograph of a cross-sectional view of a conformal silicon oxide film formed on a patterned silicon sample (dense pattern) according to an embodiment of the present invention.

FIG. 5 is a Scanning Electron Microscope (SEM) photograph of a cross-sectional view of the conformal silicon oxide film formed on the patterned silicon sample (dense pattern). The step coverage was calculated at 72%.

It will be understood by those of skill in the art that numerous and various modifications can be made without departing from the spirit of the present invention. Therefore, it should be clearly understood that the forms of the present invention are illustrative only and are not intended to limit the scope of the present invention.

We/I claim:

1. A method for restoring a porous surface of a dielectric layer formed on a substrate, comprising:
   (i) providing in a reaction space a substrate on which a dielectric layer having a porous surface with terminal hydroxyl groups is formed as an outer layer;
   (ii) supplying gas of a Si—N compound containing a Si—N bond to the reaction space without irradiating the substrate with UV light, to chemisorb the Si—N compound onto the surface with the terminal hydroxyl groups;
   (iii) irradiating the Si—N compound-chemisorbed surface with a pulse of UV light in an oxidizing atmosphere without gas of a Si—N compound containing a Si—N bond in the reaction space, to oxidize the surface and provide terminal hydroxyl groups to the surface; and (iv) repeating steps (ii) through (iii) to form a film on the porous surface of the dielectric layer for restoration.

2. The method according claim 1, wherein in step (iii), the oxidizing atmosphere is an atmosphere of oxygen.

3. The method according to claim 1, further comprising removing non-chemisorbed Si—N compound from the surface by purging the reaction space between consecutive steps (ii) and (iii).

4. The method according to claim 1, further comprising purging the reaction space between consecutive steps (iii) and (ii) when repeating steps (ii) through (iii).

5. The method according to claim 1, wherein step (ii) is conducted at a temperature of about 200° C. to about 400° C. as the temperature of the substrate.

6. The method according to claim 1, wherein the film formed in step (iv) is constituted by SiOC or SiO.

7. The method according to claim 1, wherein the Si—N compound is an organosilazane or organoaminosilane compound.

8. The method according to claim 1, wherein the dielectric layer is a low-k film formed on the substrate.

9. The method according to claim 1, wherein in step (ii), the chemisorption is a self-limiting adsorption, surface reaction.

10. The method according to claim 1, wherein in step (iv), steps (ii) through (iii) are continuously repeated more than 2 times.

11. The method according to claim 1, wherein the film formed in step (iv) has a thickness of about 0.1 nm to about 100 nm.

12. The method according to claim 1, wherein the duration of step (iii) is about 0.1 second to about 60 seconds.

13. The method according to claim 1, wherein in step (iii), the intensity of the UV light is about 40 mW/cm$^2$ to about 400 mW/cm$^2$ per area of the substrate.

14. The method according to claim 1, wherein in step (i), the porous surface of the dielectric layer is constituted by pores and is hydroxyl group-terminated by irradiating the substrate with UV light in an oxidizing atmosphere to oxidize the surface and provide terminal hydroxyl groups to the surface.

15. The method according to claim 1, wherein in step (i), the porous surface with terminal hydroxyl groups is a chemically degraded surface.

16. The method according to claim 15, wherein the chemically degraded surface is a surface damaged by etching, ashing, or cleaning.

17. The method according to claim 15, wherein the chemically degraded surface is surfaces of trenches formed on the surface of the dielectric layer.

18. The method according to claim 17, wherein the film formed in step (iv) is conformal.

19. The method according to claim 1, wherein step (ii) is conducted without applying UV light or plasma, and step (iii) is conducted without applying plasma and without supplying the Si—N compound gas.

20. The method according to claim 19, wherein an oxidizing gas for establishing the oxidizing atmosphere in step (iii) is continuously supplied throughout steps (ii) and (iii).

* * * * *